United States Patent [19]

Ikawa et al.

[11] Patent Number: 4,639,621
[45] Date of Patent: Jan. 27, 1987

[54] GALLIUM ARSENIDE GATE ARRAY INTEGRATED CIRCUIT INCLUDING DCFL NAND GATE

[75] Inventors: Yasuo Ikawa, Tokyo; Katsue Kawakyu, Kawasaki; Atushi Kameyama, Kanagawa, all of Japan

[73] Assignee: Kabushiki Kaisha Toshiba, Kawasaki, Japan

[21] Appl. No.: 804,744

[22] Filed: Dec. 5, 1985

[30] Foreign Application Priority Data

Mar. 28, 1985 [JP] Japan .................................. 60-64424

[51] Int. Cl.⁴ .................. H03K 19/094; H03K 19/20; H03K 19/017
[52] U.S. Cl. ................................... 307/450; 307/303; 307/304; 307/448
[58] Field of Search ............... 307/443, 446, 448, 450, 307/304, 303

[56] References Cited

U.S. PATENT DOCUMENTS 4,028,556  6/1977  Cachier et al. ..................... 307/450
4,300,064  11/1981 Eden .................................. 307/446
4,430,583  2/1984  Shoji .................................. 307/448

OTHER PUBLICATIONS

Eden et al, "The Prospects for Ultrahigh-Speed VLSI GaAs Digital Logic"; *IEEE JSSC;* vol. SC-14, No. 2, pp. 221-236; 4/1979.
Zuleeg et al, "Femtojoule High-Speed Planar GaAs E-JFET Logic"; *IEEE Trans. Electron Devices;* vol.—ED-25, No. 6; pp. 628-639; 6/1978.
Kobayashi et al, "A 6K-Gate CMOS Gate Array"; IEEE ISSCC 1982; 2/11/1982 Digest of Technical Papers; pp. 174-175.
IEEE Transactions on Electron Devices, vol. ED-31, No. 2, p. 144 (1984), "A Gallium Arsenide SDFL Gate Array with On-Chip RAM"; Tho T. Vu et al; Feb. 1984.
IEEE Journal of Solid-State Circuits, vol. SC-19, No. 5, p. 728 (1984), "A Gallium Arsenide Configurable Cell Array Using Buffered FET Logic"; R. N. Deming et al.
IEEE Journal of Solid-State Circuits, vol. SC-19, No. 5, p. 721 (1984), "A 1K-Gate GaAs Gate Array"; Y. Ikawa et al; Oct. 1984.

*Primary Examiner*—Larry N. Anagnos
*Attorney, Agent, or Firm*—Oblon, Fisher, Spivak, McClelland & Maier

[57] ABSTRACT

A gallium arsenide NAND gate is connected between a power source and a ground potential. The gate is comprised of a load transistor of a normally-on type field effect transistor having an output terminal and a drain connected to the power source, a first driver transistor of a normally-off type field effect transistor having a gate electrode as a first input terminal and a source-to-drain current path series-connected to that of the load transistor, and a second driver transistor of two normally-off type field effect transistors having a common gate electrode for a second input terminal and source-to-drain current paths series-connected between the power source and the ground potential through the series-connected first driver transistor and load transistor. The normally-off type field effect transistors are parallel-connected to each other so as to equally constitute a single driver transistor as the second driver transistor.

4 Claims, 9 Drawing Figures

NAND GATE

NOR GATE

NOR GATE

NAND GATE

GALLIUM ARSENIDE GATE ARRAY INTEGRATED CIRCUIT INCLUDING DCFL NAND GATE

BACKGROUND OF THE INVENTION

1. Field of the Invention

The present invention generally relates to a gate array integrated circuit and, more particularly, to a gallium arsenide (GaAs) gate array integrated circuit employing direct-coupled field effect transistor logic gates (DCFL).

2. Description of the Prior Art

In basic logic gates of a GaAs digital IC, a buffered FET Logic (referred to as "BFL"), Schottky Diode FET Logic (referred to as "SDFL") and direct-coupled FET Logic (referred to as "DCFL"), etc. are known in the art. A NAND gate, NOR gate and INVERTER are constituted by either normally-on type FET's (referred to as "D-FET"), or normally-off type FET's (referred to as "E-FET"). These conventional logic gates are disclosed, for instance, in IEEE Transactions on Electron Devices, Vol. ED-31, No. 2, page 144, entitled "A Gallium Arsenide SDFL Gate Array with On-Chip RAM" by THŌ T. VU. et al. (February, 1984) and IEEE Journal of Solid-State Circuits, Vol. SC-19, No. 5, page 728, entitled "A Gallium Arsenide Configurable Cell Array Using Buffered FET Logic" by R. N. Deming et al. (October, 1984), and IEEE Journal of Solid-State Circuits, Vol. SC-19, No. 5, page 721, entitled "A 1K-Gate GaAs Gate Array" by Y. Ikawa et al. (October 1984).

In these types of logic gates, power consumption per gate greatly differs from type to type. Typically, BFL consumes several milliwatts (mW) to several tens of mW and SDFL consumes 1 mW to several mW, while DCFL consumes only several hundred microwatts ($\mu$W) per gate. The reason for this is as follows. In both BFL and SDFL employing only the normally-on FETs (D-FET), a level shift circuit, which dissipates undesirable power, is necessarily required. In DCFL, on the other hand, no level shift circuit is needed because the normally-off type FET (E-FET) is directly coupled in DCFL.

Consequently, in order to assemble more than one thousand logic gates in a GaAs-LSI (Gallium Arsenide-Large Scale Integration), no other suitable solutions have been known in the art in view of power consumption but to employ DCFL.

In a GaAs integrated circuit, it is not possible to employ a MOS-FET such as in a silicon integrated circuit and, therefore, FET is restricted to a junction type FET (a pn junction or a Schottky junction type). In view of the integrated circuit manufactured using a silicon substrate, the Schottky junction type is used from the standpoint of the high-speed operation and fine construction requirements. As a DCFL using the Schottky junction type FET's is operated in such a mode as to apply a forward bias across the gate and source of a driver FET, a high logic level is clamped at a forward raising voltage level on the Schottky junction. For this reason, a logical level of typical DCFL is as small as about 0.6 V and a typical noise margin thereof is as small as about 0.2 V.

Now suppose that a NAND gate is constructed by the conventional method using a DCFL of a smaller logical level. FIG. 1 is one form of such a circuit arrangement. 61 denotes a load FET made of D-FET; and 62, 63 are driver FET's made of E-FETs. When in this case the driver FET 63 on the ground line side is in an ON state, the source voltage of the driver FET 62 on the load side is further increased by a voltage drop defined by the series resistance times the source-to-drain current. This series resistance is the resistance of the source-to-drain path of the driver FET when turned on. As a result, a noise margin on the low level side becomes very small and stable operation for the NAND gate can be hardly expected.

In the GaAs logic integrated circuit using the DCFL circuit, therefore, a NOR gate circuit is mainly constructed by a load FET 71 and a parallel circuit of two driver FET's 72 and 73 as shown in FIG. 2. It has been normally known that the NAND circuit can be comprised of a combination of a NOR gate and inverter. In this known arrangement, an occupation area in the whole IC pattern due to the use of two logic stages of gates (and thus an increased number of gates) is increased, as well as an operation time is delayed and thus a NAND gate of a single stage configuration is required. Since in the gate array integrated circuit the size and pattern of its basic cell are previously determined, it is undesirable from the standpoint of the wafer availability to prepare various sizes of FET's, resulting in impairing its inherent excellent characteristics.

FIG. 3 shows one pattern of a basic cell layout of a GaAs gate array of a typical DCFL (as disclosed in IEEE JOURNAL OF SOLID-STATE CIRCUITS, VOL. SC-19, No. 5 October, 1984 "A 1K-Gate GaAs Gate Array" by Y. Ikawa et al. FIG. 7a). In the basic cell 81 shows a D-FET serving as a load, and 82, 83 and 84 show E-FETs working as a driver. Connecting E-FETs 82, 83 and 84 in parallel configuration with the use of such a basic cell provides a 3-input NOR gate as shown in FIG. 4. In the layout of FIG. 3 the respective FETs 82, 83 and 84 are connected to the ground line "GND" as indicated by a broken line 85.

It is, however, difficult to constitute a GaAs NAND gate for DCFL, using the single basic cell as set out above, i.e., with no need of using an increased number of logic stages.

A primary object of this invention is to provide a GaAs gate array integrated circuit which permits the use of a stably operated NAND gate employing an optimally integrable DCFL and the full use of a basic cell in view of the entire wafer area.

Another object of this invention is to provide a GaAs gate array integrated circuit comprised of NAND gates having a lower signal delay.

SUMMARY OF THE INVENTION

These objects of this invention can be accomplished by providing a gallium arsenide gate array integrated circuit comprising a plurality of direct-coupled field effect transistor logic gates connected between a power source and a ground potential, which logic gates including:

a normally-on type field effect transistor functioning as a load transistor having an output terminal and a drain connected to the power source; and a plurality of normally-off type field effect transistors functioning as at least two independent driver transistors having respective input terminals and series-connected between the power source and the ground potential through the load transistor, one of which driver transistors includes a plurality of normally-off type field effect transistors parallel-connected to each other so as to equally constitute a single driver transistor, the source of which is connected to the ground potential.

BRIEF DESCRIPTION OF THE DRAWINGS

For a better understanding of these and other objects of this invention, reference is made to the following detailed description of the invention to be read in conjunction with the following drawings, in which.

DETAILED DESCRIPTION OF THE PREFERRED EMBODIMENTS

Figure 5:
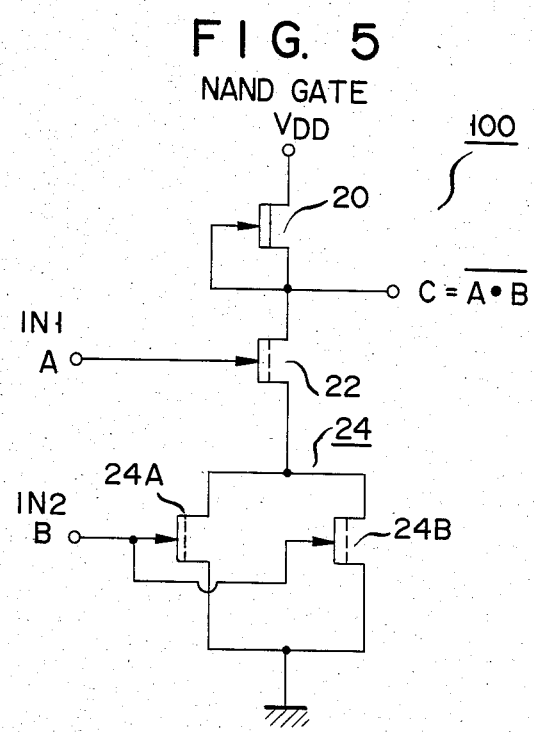
FIG. 5 is a circuit diagram of a 2-input NAND gate according to one preferred embodiment.

Referring now to FIG. 5, a two-input NAND gate 100 will be described according to one preferred embodiment of this invention. This NAND gate 100 is preferably used in a GaAs gate array integrated circuit (not shown in detail).

The NAND gate 100 includes a load FET 20 of a normally-on type (D-FET), a first driver FET 22 of a normally-off type (E-FET) and a second driver FET 24 consisting of parallel-connected FET's 24A and 24B. As seen from the circuit diagram of FIG. 5, a source-to-drain current path of the load FET 20 is connected in series to those of the first and second FET's 22 and 24. An output terminal "C" is provided on a junction between the load FET 20 and the first driver FET 22. The first driver FET 22 has a gate electrode as a first input terminal "$IN_1$". The second driver FET's 24A and 24B are of the normally-off type (E-FET), gate electrodes of which are commonly connected so as to provide a second input terminal "$IN_2$". The sources of both FET's 24A and 24B are commonly grounded.

Figure 6:
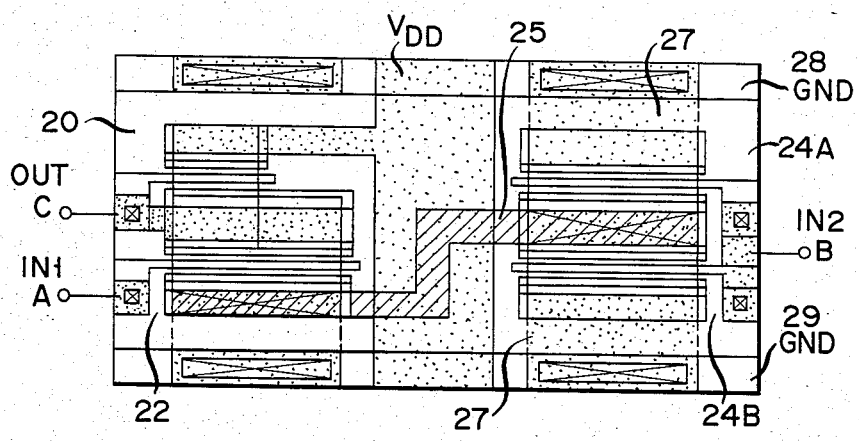
FIG. 6 shows a layout of the NAND gate shown in FIG. 5.

Referring to FIG. 6, a layout is shown for such a NAND gate 100 of FIG. 5.

Figure 1:
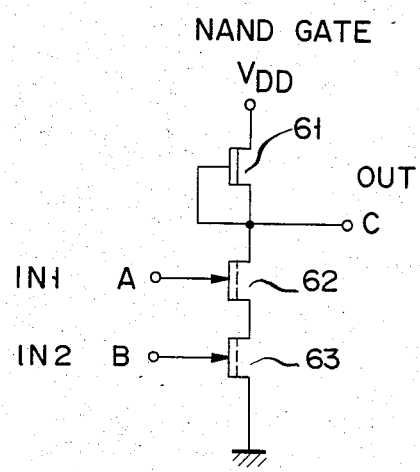
FIG. 1 is a circuit diagram of a conventional NAND gate employing a DCFL.
Figure 2:
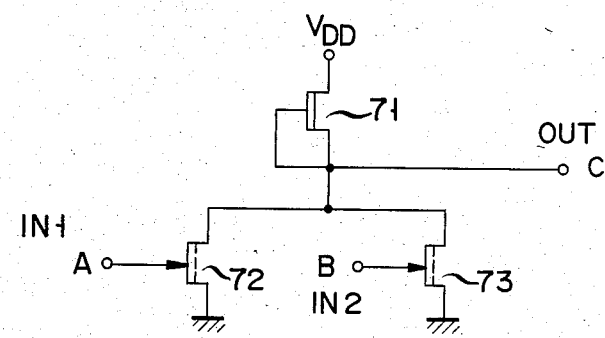
FIG. 2 is a circuit diagram of a conventional 2-input NOR gate employing DCFL.
Figure 3:
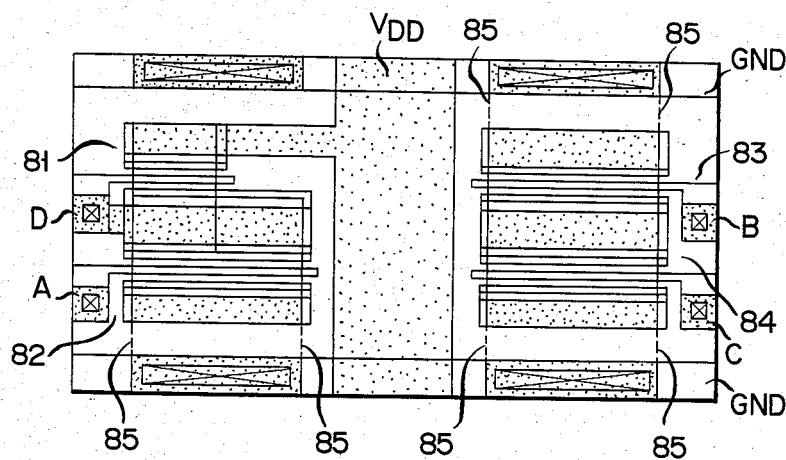
FIG. 3 shows a layout of a typical basic cell for a GaAs gate array.
Figure 4:
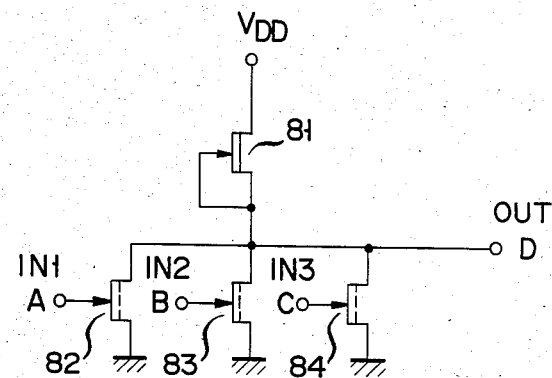
FIG. 4 is a circuit diagram of a conventional 3-input NOR gate employing a DCFL.

It should be noted that a basic cell of FIG. 6 is exactly the same as that of FIG. 3 except for a wire connection. That is, the basic cell is constituted by a single D-FET 20 and three E-FET's 22, 24A and 24B. The D-FET 20 is provided as a load FET, the first E-FET 22 is connected as a first driver FET in series with the load FET 20, and the second E-FET 24A and the third E-FET 24B are connected in parallel to each other and in series with the first driver FET 22 so as to constitute a second driver FET 24. To arrange such a 2-input NAND gate 100, an electronic conductor 25 is used to bridge the first driver FET 22 and the second E-FET 24A of the second driver FET 24, and conductors 27 are employed to connect the second E-FET 24A and third E-FET 24B to the ground lines 28 and 29. Thus, such a complete NAND gate 100 can be assembled by using only one basic cell as shown in FIG. 6.

According to this embodiment, the turn-on resistance of the second driver FET 24 on the ground side becomes equivalently lower and the high level of the driver FET 22 at the first input $IN_1$ is set to maintain a noise margin of about 0.2 V, thus implementing a NAND gate 100 assuring its stable operation. Furthermore, it is possible to provide not only an inverter, a 2-input or a 3-input NOR gate but also a 2-input NAND gate 100, using the same basic cell as the conventional counterpart including E-FET's of the same dimension. These features permit an effective layout of the GaAs gate array as well as a high-speed logic unit.

Although, in the first embodiment, the 2-input NAND gate 100 has been explained as having a cascode-connected array of two driver FETs as the logic gate, this invention can, effectively, be equally applied to a 3-input NAND gate 200 (see FIG. 7) with, for example, a cascode-connected array of three driver FET's as the logic gate. In this logic gate, the driver FET arrangement may comprise one FET at a load side, an intermediate parallel array of two FET's and a parallel circuit of three FET's at the ground side. This specific arrangement can be implemented with the use of such two basic cells as employed in the above-mentioned embodiment, if use is made of this type of basic cell.

Figure 7:
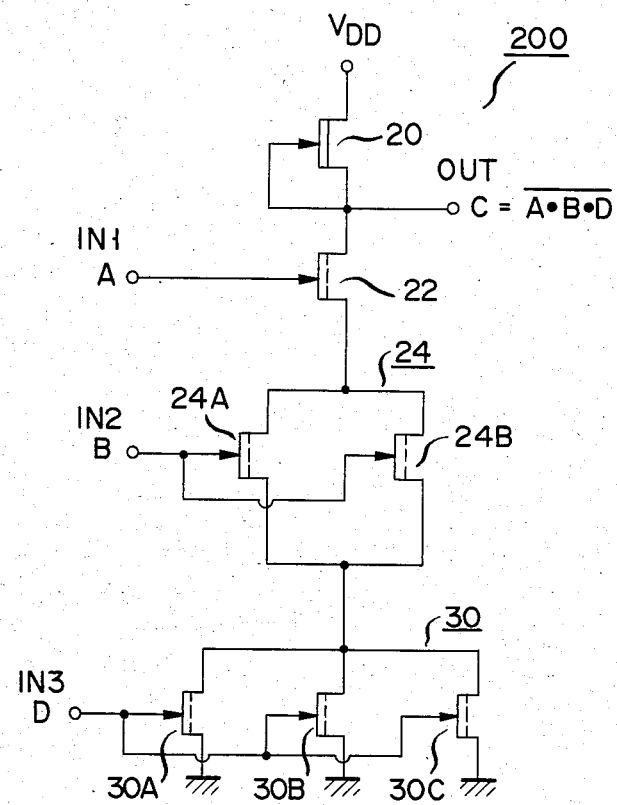
FIG. 7 is a circuit diagram of a 3-input NAND gate according to a second embodiment of this invention.

FIG. 7 is a circuit diagram showing the above-mentioned 3-input NAND gate 200 according to a second embodiment of this invention. In this embodiment, the same reference numerals are employed to designate the same or similar elements shown in the first embodiment. Since the arrangement of the second embodiment is similar to that of the first embodiment with respect to a circuit portion including the load FET 20 to the second input $IN_2$, only the remaining portion of the second embodiment will be explained below. A parallel circuit arrangement of three E-FET's 30A, 30B and 30C is connected, as a third driver FET 30, in series with the second driver FET 24. Commonly connected gates of the E-FETs 30A, 30B and 30C function as a third input $IN_3$. In this way, it is possible to provide the 3-input NAND gate 200. This NAND gate 200 can implement the same noise margin and high-speed operation characteristics as those of the above-mentioned 2-input NAND gate 100.

As seen from the foregoing, the second driver FET 24 includes the parallel circuit of E-FET's 24A and 24B, and the third driver FET 30 at the ground side includes the parallel circuit of three E-FET's 30A to 30C. The reason for this specific arrangement is that it is possible to improve the noise margin by making the parallel resistance (that is, the turn-on resistance) of the driver FET at the ground side as low as possible.

Figure 8:
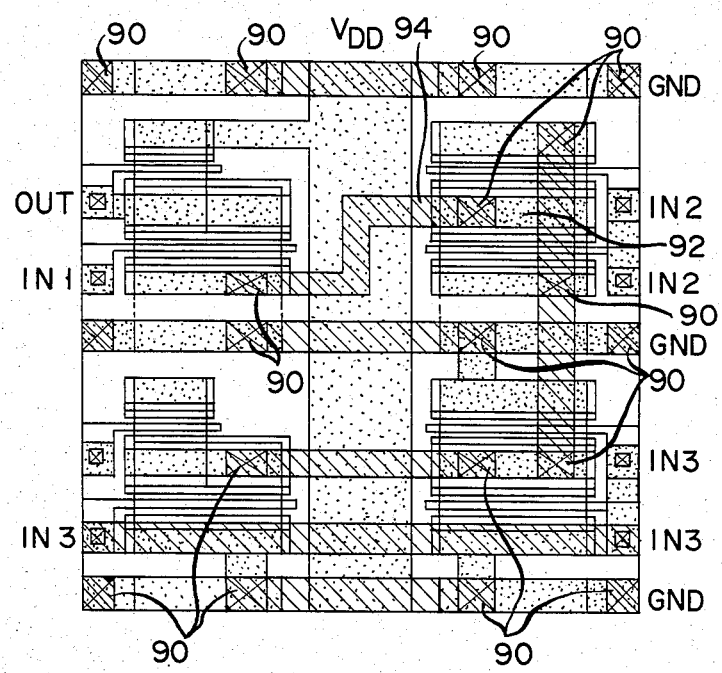
FIG. 8 shows a layout of the 3-input NAND gate shown in FIG. 7.
Figure 9:
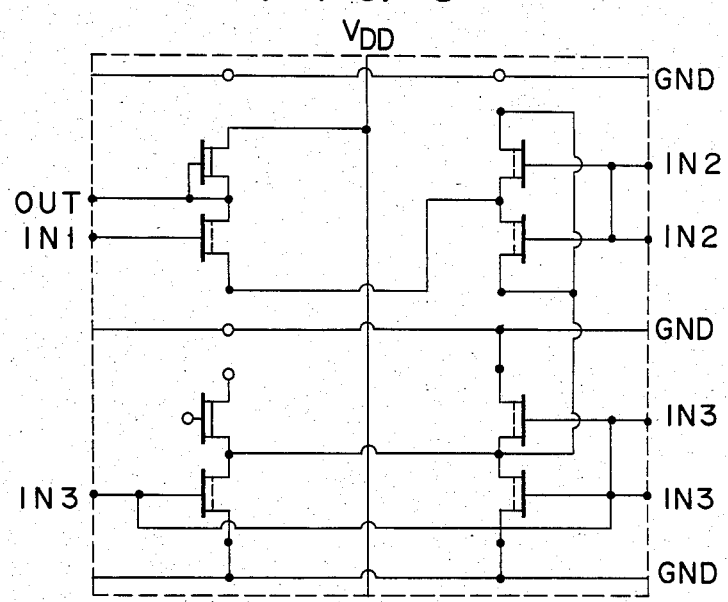
FIG. 9 is an actual circuit arrangement of the 3-input NAND gate shown in FIG. 7.

Referring to a layout and an actual circuit arrangement of the 3-input NAND gate 200 shown in FIGS. 8 and 9, the above-described features of this second embodiment may be easily understood. In the layout of FIG. 8, through holes denoted by numeral 90 are formed between the first and second layers 92 and 94. The first layers 92 are indicated by dotted areas and the second layers 94 are denoted by hatched area in the drawing of FIG. 8.

According to this invention a plurality of E-FET's are connected in a parallel circuit arrangement so as to function as a single equivalent driver FET and thus the GaAs gate array can perform a stable logical operation with a smaller turn-on resistance and a smaller logical amplitude with DCFL as a basic cell. Furthermore, it is possible to constitute a NAND gate using the basic cell of a DCFL type including a plurality of E-FET's of the same size, and thus it is possible to implement a highly integrated gate array with a very effective cell area. That is, as in the case of the basic cell in the conventional gate array of a Si-CMOS configuration which can be used as a NOR gate or a NAND gate, it is possible according to this invention to implement such a compatibility with the use of the GaAs gate array. Since it is not necessary to constitute a GaAs NAND circuit from a combination of, for example, the NOR gate and inverter, a high-speed array as well as the full utilization of elements can be realized.

What is claimed is:

1. A gallium arsenide gate array integrated circuit comprising:
    a plurality of direct-coupled field effect transistor logic NAND gates connected between a power source and a ground potential, each of said logic gates including:
    a normally-on type field effect transistor functioning as a load transistor having an output terminal and a drain connected to the power source; and
    a plurality of normally-off type field effect transistors functioning as at least two independent driver transistors having respective input terminals and series-connected between the power source and the ground potential through the load transistor, one of which driver transistors includes a plurality of normally-off type field effect transistors having a common gate connection and parallel-connected to each other so as to jointly constitute a single driver transistor made up by two normally-off type field effect transistors and with said single driver transistor connected to the ground potential by one of its source and drain terminals and to the other of said driver transistors by the other of said source and drain terminals.

2. A circuit as claimed in claim 1, wherein the NAND gate is constituted by a single basic cell including a normally-on type field effect transistor and three normally-off type field effect transistors having the same size.

3. A gallium arsenide gate array integrated circuit comprising:
    a plurality of direct-coupled field effect transistor logic NAND gates connected between a power source and a ground potential, each of said logic gates including:
    a normally-on type field effect transistor functioning as a load transistor having an output terminal and a drain connected to the power source; and
    a plurality of normally-off type field effect transistors functioning as at least three independent driver transistors having respective input terminals and series-connected between the power source and the ground potential through the load transistor, one of which driver transistors includes a plurality of three normally-off type field effect transistors having a common gate connection and parallel-connected to each other so as to jointly constitute a single driver transistor and with said single driver transistor connected to the ground potential by one of its source and drain terminals and to another of said driver transistors by the other of said source and drain terminals.

4. A gallium arsenide gate array integrated circuit comprising:
    a plurality of direct-coupled field effect transistor logic NAND gates connected between a power source and a ground, each of said logic gates comprising:
    a first driver transistor;
    a second driver transistor comprised of two field-effect transistors which have mutually connected drains and gates and jointly constitute said second driver transistor;
    a conductor means for connecting the source of said first driver transistor to the mutually connected drains of the two field-effect transistors of said second driver transistor with said two field effect transistors being positioned in an axially symmetrical relationship with said conductor means; and
    two parallel ground lines with the sources of said two field effect transistors connected each to a respective ground line.

* * * * *